United States Patent
Gross (10) Patent No.: US 9,188,618 B2
(45) Date of Patent: Nov. 17, 2015

(54) SYSTEM FOR SIMULATING ELECTROMAGNETIC ENVIRONMENTS INCLUDING A NETWORK OF A PLURALITY OF PROBES

(75) Inventor: Nicolas Gross, Gif S/Yvette (FR)

(73) Assignee: Satimo Industries (FR)

(*) Notice: Subject to any disclaimer, the term of this patent is extended or adjusted under 35 U.S.C. 154(b) by 276 days.

(21) Appl. No.: 13/695,901

(22) PCT Filed: Apr. 26, 2011

(86) PCT No.: PCT/EP2011/056571
§ 371 (c)(1),
(2), (4) Date: Nov. 2, 2012

(87) PCT Pub. No.: WO2011/138190
PCT Pub. Date: Nov. 10, 2011

(65) Prior Publication Data
US 2013/0099985 A1    Apr. 25, 2013

(30) Foreign Application Priority Data
May 7, 2010 (FR) ....................... 10 53593

(51) Int. Cl.
G01R 29/08    (2006.01)
H04B 17/00    (2015.01)
(Continued)

(52) U.S. Cl.
CPC ............ *G01R 29/0878* (2013.01); *G01R 29/10* (2013.01); *H04B 17/0087* (2013.01); *H04B 17/21* (2015.01); *H04B 17/3912* (2015.01)

(58) Field of Classification Search
CPC ............... H04B 17/0087; H04B 17/21; H04B 17/3912; G01R 29/0878; G01R 29/10

USPC .......................... 343/703; 455/67.14
See application file for complete search history.

(56) References Cited

U.S. PATENT DOCUMENTS

2005/0260949 A1* 11/2005 Kiss et al. ................. 455/67.14
2008/0056340 A1    3/2008 Foegelle
(Continued)

FOREIGN PATENT DOCUMENTS

| EP | 2053764 A1 | 4/2009 |
|---|---|---|
| JP | H10-022889 | 1/1998 |
| JP | 2005227213 A | 8/2005 |

OTHER PUBLICATIONS

International Search Report for Application No. PCT/EP2011/056571 dated Jul. 28, 2011.
(Continued)

*Primary Examiner* — Robert Karacsony
*Assistant Examiner* — Daniel J Munoz
(74) *Attorney, Agent, or Firm* — Lerner, David, Littenberg, Krumholz & Mentlik, LLP (57) ABSTRACT

The invention concerns a system for simulating electromagnetic environments, including a network of emitting and/or receiving probes to test at least one test antenna, channels for connecting the probes to a channel emulator, a signal emitting unit, a signal receiving unit, one of the units being connected to the emulator. The invention is characterized by a switching device having a first measurement position, in which the device connects the emulator respectively to at least one of the probes via the associated channel and connects the other unit to the test antenna, and a second position for calibrating the channels, in which the switching device connects the emulator to the other unit via the associated channel without passing through the network of probes.

13 Claims, 8 Drawing Sheets

(51) Int. Cl.
  *G01R 29/10* (2006.01)
  *H04B 17/21* (2015.01)
  *H04B 17/391* (2015.01)

(56) References Cited

U.S. PATENT DOCUMENTS

2008/0129615 A1* 6/2008 Breit et al. .................... 343/703
2010/0295569 A1* 11/2010 Chu et al. ...................... 324/754
2011/0084887 A1* 4/2011 Mow et al. .................... 343/703
2012/0001810 A1* 1/2012 Soualle et al. ................ 343/703

OTHER PUBLICATIONS

French Search Report for Application No. FR1053593 dated Jan. 14, 2011.

* cited by examiner

SYSTEM FOR SIMULATING ELECTROMAGNETIC ENVIRONMENTS INCLUDING A NETWORK OF A PLURALITY OF PROBES

CROSS REFERENCE TO RELATED APPLICATIONS

The present application is a national phase entry under 35 U.S.C. §371 of International Application No. PCT/EP2011/056571, filed on Apr. 26, 2011, which claims priority from French Patent Application No. 1053593 filed on May 7, 2010, the disclosures of which are incorporated by reference herein.

The invention relates to a system for generating electromagnetic environments including at least one network of probes for emitting electromagnetic radiations towards a test area in order to test an object under test located in this test area. The object under test consists in at least one antenna. The configuration of the network of emission probes may be transposed into a configuration of a network of receiving probes.

A field of application of the system for generating electromagnetic environments is the test of various objects under test including one or more antennas which may be accessed individually or else simultaneously, said antennas may either be connected or not to one or more integrated receivers or emitters. These objects under test may for example be mobile telephones, so-called <<wireless>> appliances or any other antenna device for civil, aeronautical or military applications, associated with one or more on-board receivers. For example, a type of tests known to one skilled in the art relates to the characterization of so-called <<MIMO>> (Multiple Input Multiple Output) appliances with multiple inputs and multiple outputs.

Therefore the possibility is sought of testing the object under test by subjecting it to various electromagnetic radiations from the probes, said probes are for example angularly distributed around the test area.

At least one signal generator is provided for generating one or more radio frequency signals (RF signals). The signal generator may for example be a network analyzer or a frequency synthesizer generating an RF signal at discrete frequencies, a radio communications tester generating a modulated RF signal according to a communications protocol or any other RF signal source. At least one signal receiver is provided for receiving one or more radio frequency signals. The signal receiver may be integrated to the signal generator like in the case of the network analyzer or the radio communications tester or else be positioned away from the generator like in the case of a receiver associated with a frequency synthesizer. With the receiver, it is possible to collect the response of the object under test in order to be able to then evaluate it in terms of transmission or communications quality for example.

A channel emulator is used in order to be able to multiplex and transform radio frequency signal(s) coming from the signal generator through one or more channels. The signal of each channel is transmitted in a conducted mode to a probe which radiates it towards the test area. With the channel emulator, it is for example possible to, independently for each channel, vary the phase, amplitude, frequency and group time of the signal which is emitted by the probe. The probes may have a single circular or linear polarization or else two orthogonal polarizations. In order to transmit the signal at each probe polarization individually and if necessary differently from the other polarizations of the other probes, each probe polarization may be associated with a channel through which it receives the signal to be emitted.

The test system consisting of the RF signal generator and the receiver, of the channel emulator and of the network of probes may thus be used for generating electromagnetic environments which the object under test may encounter during its normal use in a real environment outside the test. Such a device is known for example from document US-A-2008/0056340.

Generally, it is known that for calibrating the system for generating electromagnetic scenarios, different dipoles are used with responses known beforehand and placed as antennas in the center of the test area.

Such dipoles have the drawback of being with a narrow frequency band, which requires that a large number of them be used for achieving calibration, and further of being with a single polarization, which requires for each frequency band, the use of two dipoles of different polarizations in the center of the test area in the case of a system equipped with a network of bipolarized probes.

By means of the thereby conducted measurements with known dipoles placed in the center of the test area, the characteristics of each channel are corrected in order to match the response of the dipoles to a predefined set signal. This correction has the main purpose of uniformizing the response of each channel in terms of group time, amplitude and phase response from the signal generator up to the dipole. It is also known that one skilled in the art may use antennas of the type of antennas with magnetic loops or slots instead of dipoles, for example. But the latter have drawbacks similar to those of the dipoles.

Therefore, this calibration is lengthy, complicated, laborious and difficult to apply.

Another major drawback of this calibration technique by means of dipoles is the absence of a calibration of the actual probe network. Indeed, the calibration technique using dipoles mainly corresponds to a uniformization of the transmission paths between the signal generator via the channel emulator and the probe network up to the dipole. In no way does this correspond to the calibration of the network of probes per se, which for example allows uniformization of the radio-electric axis of each of the polarizations of the probes without which it is not possible to guarantee quality measurements by means of the network of probes.

Finally, another major drawback of this calibration technique by means of dipoles is the intrinsic instability of the applied correction. Indeed, once it is calibrated with this method, the system for generating electromagnetic scenarios does not have a stable response over time, which challenges the measurements conducted with the different objects under test for which characterization of the behavior is desired with regard to radiations emitted by the probes. This is mainly due to the fact that the channel emulator and the actual channels include active microwave frequency elements, the responses of which vary over time and according to temperature for example. This is expressed by fluctuations during the day of the measured responses of the object under test: the test carried out at a first time of the day from first signals with a first object under test will give a first response of the latter and the same tests carried out at a second time of the day from the same first signals on the same first object under test may give a second response different from the first response and unpredictable. Therefore, the tests are not reproducible, except if the calibration by means of the dipoles is frequently repeated during the day, which becomes a big handicap in terms of the measuring rate. This may be worsened by the fact that certain channel emulators require calibration at each start.

The invention is directed to obtain a simplified and automatable calibration for each channel. This calibration of each of the channels is independent of the calibration of the actual network of probes and with which the drawbacks described above may be overcome.

For this purpose, a first subject matter of the invention is a system for simulating electromagnetic environments, including:
a network (200) of a plurality of probes ($S_i$) for emitting and/or receiving electromagnetic radiations to or from a test point at a distance from the probes ($S_i$) in order to test at least one test antenna (300) located at the test point,
a multiplicity of channels (C) for connecting the probes to a channel emulator (600),
a first signal emitting unit (400),
a second signal receiving unit (410),
one of the first and second units (400, 410) being connected to the channel emulator (600),
characterized by a switching device (100) having a first measurement position, in which the switching device (100) connects the emulator (600) respectively to at least one ($S_i$) of the probes via said at least one associated channel (C) and connects the other of the first and second units (410, 400) to the test antenna (300), and a second position for calibrating the channels (C), in which the switching device (100) connects the emulator (600) to the other of the first and second units (410, 400) via said at least one associated channel (C) without passing through the network (200) of probes ($S_i$), the second position being distinct from the first position.

According to an embodiment of the invention, the channel emulator (600) is connected to the first signal emitting unit (400), the switching device (100) in the first measurement position connects the emulator (600) respectively to at least one ($S_i$) of the probes via said at least one associated channel (C) and connects the second signal receiving unit (410) to the test antenna (300), and the switching device (100) in the second position for calibrating the channels (C) connects the emulator (600) to the second signal receiving unit (410) via said at least one associated channel (C) without passing through the network (200) of probes ($S_i$).

According to an embodiment of the invention, the channel emulator (600) is connected to the second receiving unit (410), the switching device (100) in the first measurement position connects the emulator (600) respectively to at least one ($S_i$) of the probes via said at least one associated channel (C) and connects the first signal emitting unit (400) to the test antenna (300), and the switching device (100) in the second position for calibrating the channels (C) connects the emulator (600) to the first emitting unit (400) via said at least one associated channel (C) without passing through the network (200) of probes ($S_i$).

According to an embodiment of the invention, the switching device (100) in the first measurement position connects a multiplicity of accesses (A) of the emulator (600) respectively to the plurality of the probes ($S_i$) via the multiplicity of the associated channels (C) and connects the other of the first and second units (410, 400) to the test antenna (300), and the switching device (100) in the second position for calibrating the channels (C) connects the multiplicity of accesses (A) of the emulator (600) to the other of the first and second units (410, 400) via the multiplicity of the associated channels (C) without passing through the network (200) of probes ($S_i$), the second position being distinct from the first position.

According to an embodiment of the invention, the channel emulator 600 has controllable transformation means (T) for individually varying for each channel (C) at least one parameter from frequency, phase, amplitude and polarizations of the signal of each associated probe ($S_i$).

According to an embodiment of the invention, it includes means (116, 122, 135) for controlling the switching device (100) for having it pass between both of the first and second positions and for maintaining it in any of the first and second positions.

According to an embodiment of the invention, the switching device (100) includes switches or the like (11, 13) having said positions for ensuring said connections.

According to an embodiment of the invention, it comprises a unit (700) for generating two first and second polarizations orthogonal to each other in order to divide the signal conveyed by said at least one channel (C) into two first and second routes (710) having both first and second polarizations orthogonal to each other, respectively, both routes being connected to the associated probe ($S_i$), weighting means being provided for weighting each of the two first and second routes (710) in amplitude and in phase.

According to an embodiment of the invention, the test antenna (300) is connected to the other of the first and second units (410, 400) through wiring via at least one cable (330).

According to an embodiment of the invention, the test antenna (300) is connected wirelessly to the other of the first and second units (410, 400) via at least one radio link with an on-board emitter and/or receiver (320). In this case, reception/emission is accomplished in the object under test and the radio (RF for radio frequency) link is only used for recovering useful values.

According to an embodiment of the invention, the switching device (100) is placed between the channel emulator (600) and the network (200) of probes ($S_i$).

Another subject matter of the invention, is a method for simulating electromagnetic environments by means of a system (1) as described above, the system including a network (200) of a plurality of probes ($S_i$) for emitting and/or receiving electromagnetic radiations to or from a test point at a distance from the probes ($S_i$) in order to test at least one test antenna (300) located at the test point, a multiplicity of channels (C) for connecting the probes to a channel emulator (600), a first signal emitting unit (400), a second signal receiving unit (410), one of the first and second units (400, 410) being connected to the channel emulator (600),
characterized in that
the switching device (100) is placed in the second position for calibrating the channels (C), in which the switching device (100) connects the emulator (600) to the other of the first and second units (410, 400) via said at least one associated channel (C) without passing through the network (200) of probes ($S_i$),
in the second position for calibrating the channels (C) the value of a complex transmission coefficient is acquired on each channel (C) between the first signal emitting unit (400) and the second signal receiving unit (410) while passing through the channel emulator (600) without passing through the network (200) of probes ($S_i$),
the switching device (100) is then placed in the first measurement position, in which the switching device (100) connects the emulator (600) respectively to at least one ($S_i$) of the probes via said at least one associated channel (C) and connects the other of the first and second units (410, 400) to the test antenna (300),
the test antenna (300) is tested in the first measurement position by sending at least one signal from the first signal emitting unit (400) to the second signal receiving unit (410) via said at least one channel (C) through said at least one probe ($S_i$) and by applying to the signal a correction calculated according to at least the value having been acquired from the complex transmission coefficient on said at least one channel (C).

According to an embodiment of the invention, the correction is calculated according to at least the value having been acquired from the complex transmission coefficient on said at least one channel (C) and further according to transmission parameters having been measured beforehand on the device.

In an embodiment of the invention, a multiplicity of channels each transmit a signal coming from a radio frequency signal generator to a probe of a network of a plurality of probes for emitting electromagnetic radiations. This calibration device is reciprocal and allows calibration of a multiplicity of channels each transmitting a signal coming from a probe of a network of a plurality of probes for receiving electromagnetic radiations to a radio frequency signal receiver.

In embodiments, this device is characterized:
  in that it is inserted between the channel emulator and the network of probes,
  in that it consists of an assembly of switches, dividers and/or couplers having a first so-called measurement position giving the possibility of connecting at least one of the first outputs of the channel emulator respectively to at least one of the probes of the network via at least one associated channel and of connecting the antenna under test to the receiver of radio frequency signals when the antenna under test operates as a receiving antenna, and a second so-called channel calibration position, in which the arrangement of switches, dividers and/or couplers connects at least one of the first outputs of the emulator to the input of the receiver without passing through the network of probes, the second position being distinct from the first position.
  in that, when the object under test is wireless and for the assembly of switches, dividers and/or couplers having the first so-called measurement position, it gives the possibility of connecting at least one of the first outputs of the channel emulator respectively to at least one of the probes of the network via at least one associated channel and of connecting a communications antenna, located in the measurement chamber and ensuring a radiated link with the object under test, to the receiver of radio frequency signals during the measurement of the object under test, receiving signals from the probes of the network. The radio frequency signal generator and receiver correspond here generally to what one skilled in the art calls a radio communications tester. The arrangement for the assembly of switches, dividers and/or couplers having the second so-called channel calibration position, gives the possibility of connecting at least one of the first outputs of the emulator to the input of the receiver without passing through the network of probes.

According to embodiments of the invention:
  For an antenna under test powered through a cable and operating as a receiver, in the first so-called measurement position, the switching assembly connects the multiplicity of the first outputs of the emulator respectively to the plurality of probes via the multiplicity of the associated channels, and connects the antenna under test to the input of the radio frequency signal receiver, and in the second so-called channel calibration position, the switching assembly connects the multiplicity of the first outputs of the emulator to the receiving input of the analysis unit without passing through the network of probes, the second position being distinct from the first position.
  For an antenna under test powered through a cable and operating as an emitter, in the first so-called measurement position, the switching assembly connects the multiplicity of the first inputs of the emulator respectively to the plurality of the probes via the multiplicity of the associated channels and connects the antenna under test to the output of the radio frequency signal generator, and in the second so-called channel calibration position, the switching assembly connects the multiplicity of the first inputs of the emulator to the output of the radio frequency signal generator without passing through the network of probes, the second position being distinct from the first position.
  For a wireless object under test receiving signals from the probes of the network, in the first so-called measurement position, the switching assembly connects the multiplicity of the first outputs of the emulator respectively to the plurality of probes via the multiplicity of the associated channels and connects the communications antenna, located in the measurement chamber and ensuring a radiated link with the object under test, to the input of the radio frequency signal receiver, and in the second so-called channel calibration position, the switching assembly connects the multiplicity of the first outputs of the emulator to the receiving input of the analysis unit without passing through the network of probes, the second position being distinct from the first position.
  For a wireless object under test emitting towards the probes of the network, in the first so-called measurement position, the switching assembly connects the multiplicity of the first inputs of the emulator respectively to the plurality of probes via the multiplicity of the associated channels and connects the communications antenna, located in the measurement chamber and ensuring a radiated link with the object under test, to the output of the radio frequency signal generator, and in the second so-called channel calibration position, the switching assembly connects the multiplicity of the first inputs of the emulator to the output of the radio frequency signal generator without passing through the network of probes, the second position being distinct from the first position.
  The calibration device includes means for controlling the switching assembly in order to have it pass between both of the first and second positions and for maintaining it in any one of the first and second positions.
  The switching assembly includes switches, dividers and/or couplers and/or the like having said positions for ensuring said connections.

According to an embodiment of the invention, a method for calibrating the channels between the output of the RF signal generator as far as the input of the probes of a network of a plurality of radiation emitting probes, by means of a calibration device as indicated above, is provided, characterized in that:
  the switching assembly is placed in the second so-called channel calibration position, in which the switching assembly connects at least one of the first outputs of the channel emulator to the receiving input of an analysis unit without passing through the network of probes,
  and the values of the complex transmission coefficient for each channel between the generator and the radio frequency signal receiver passing through the channel emulator are then acquired and recorded, the switching assembly is then placed in the so-called measurement position, in which the switching assembly connects at least one of the first outputs of the emulator respectively to at least one of the probes via said at least one associated channel and connects the receiving input to the test antenna.

and during the measurement or after the measurement of the antenna under test, complex corrections are then applied, obtained for each channel from recorded complex values of the transmission coefficients when the switching assembly was placed in the second so-called channel calibration position. With this correction, it is possible to uniformize the characteristics of the channels notably in terms of phase, and amplitude and group time by including the characteristics and the variabilities of the channel emulator and of all the active elements placed between the radio frequency signal generator and the inputs of the probes of the network.

finally, it is possible to apply to this correction of the different channels, a second correction, the values of which are obtained from the calibration of the probe network carried out in addition and in a totally independent way of the calibration of the channels.

The invention will be better understood in the light of the description which follows, only given as a non-limiting example with reference to the appended drawings wherein.

According to an embodiment of the invention, the device for calibrating the channels 100 is applied within a system for generating electromagnetic environments 1 consisting of at least one network of probes 200 for receiving or emitting electromagnetic radiations towards a test area in order to test an object 300 under test, located in this test area, of a signal generator 400 for generating one or more radio frequency signals, of a signal receiver 410 for receiving and analyzing one or more radio frequency signals and a channel emulator 600 used in order to be able to multiplex and transform radio frequency signal(s) coming from the signal generator 400 through one or more channels C up to the inputs E of the probes S of the network 200. The number of probes S of the network of probes 200 is greater than or equal to two.

Each probe S is capable of emitting electromagnetic radiation according to a predetermined radiation pattern which is specific to it. The probes S of the network are for example oriented so that the maximum of these radiation patterns point towards the center of the test area. The radiation patterns are fixed relatively to their associated probes. Of course, the probes S may also be oriented otherwise in order to radiate in any directions other than towards the center of the test area.

Figure 1:
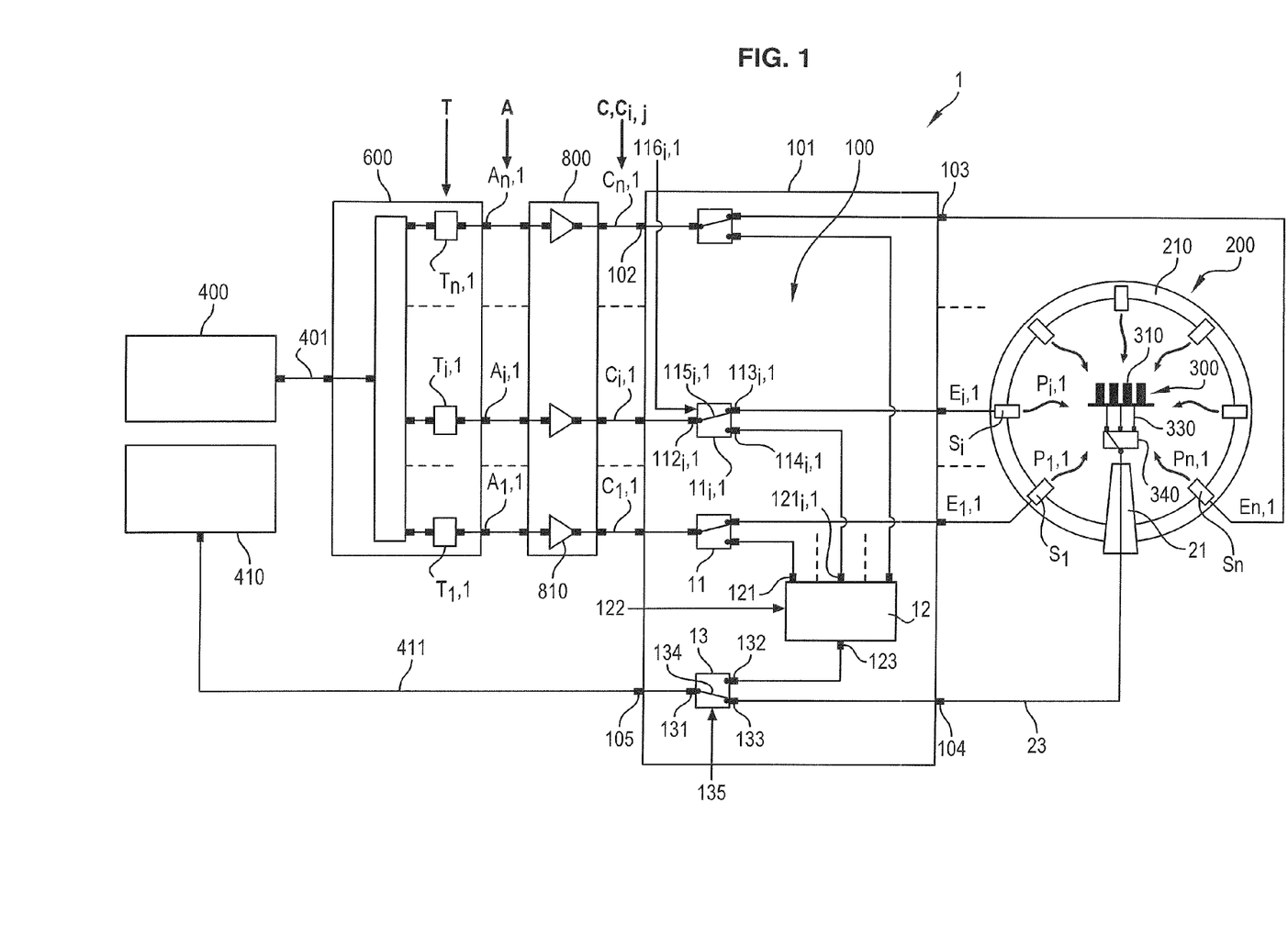
FIG. 1 is a schematic view of the device for calibrating the channels according to an embodiment of the invention, and applied in a system for generating electromagnetic environments with a first position of the switching assembly for conducting the measurement of an assembly of antennas under test powered through a cable and operating as receivers.
Figure 2:
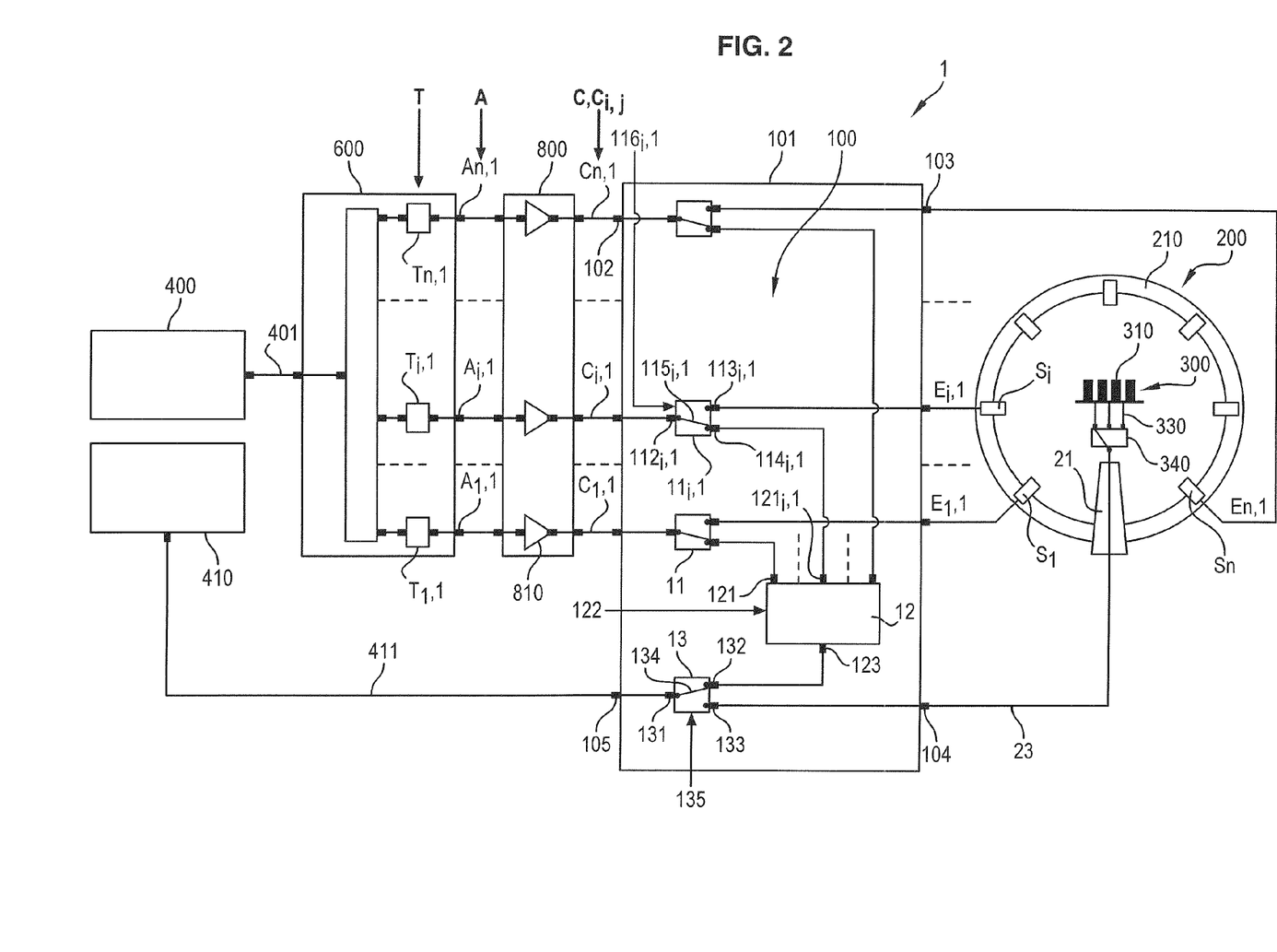
FIG. 2 is a schematic view of the calibration device of FIG. 1 according to an embodiment of the invention with a second position of the switching assembly for conducting the measurement for calibrating the channels.

In the center of the test area, an object under test 300 is placed, consisting of one or more antennas 310 which may be connected to an on-board emitter or receiver 320 like in FIGS. 3 to 8 (this is then referred to as a wireless object under test like in the case of a mobile telephone or a portable computer) or else directly powered through cables 330 and selected by a switch 340 like in FIGS. 1 and 2 (this is then referred to as antennas under test powered through a cable).

Figure 6:
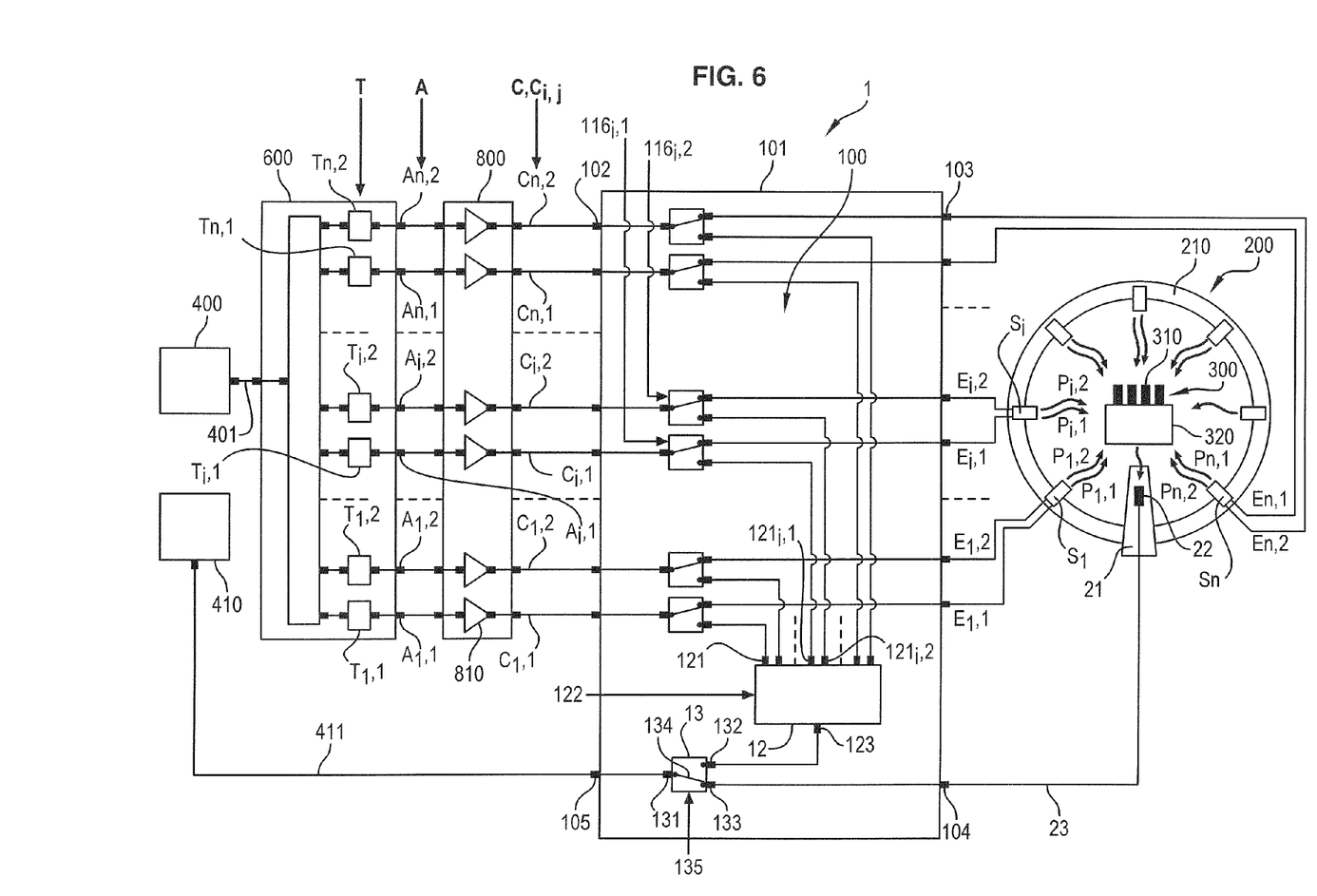
FIG. 6 is a schematic view of the device for calibrating the channels according to an embodiment of the invention and applied in a system for generating electromagnetic environments with a first position of the switching assembly in order to conduct the measurement of a wireless object under test receiving the signals from the bipolarized probes of the network.
Figure 7:
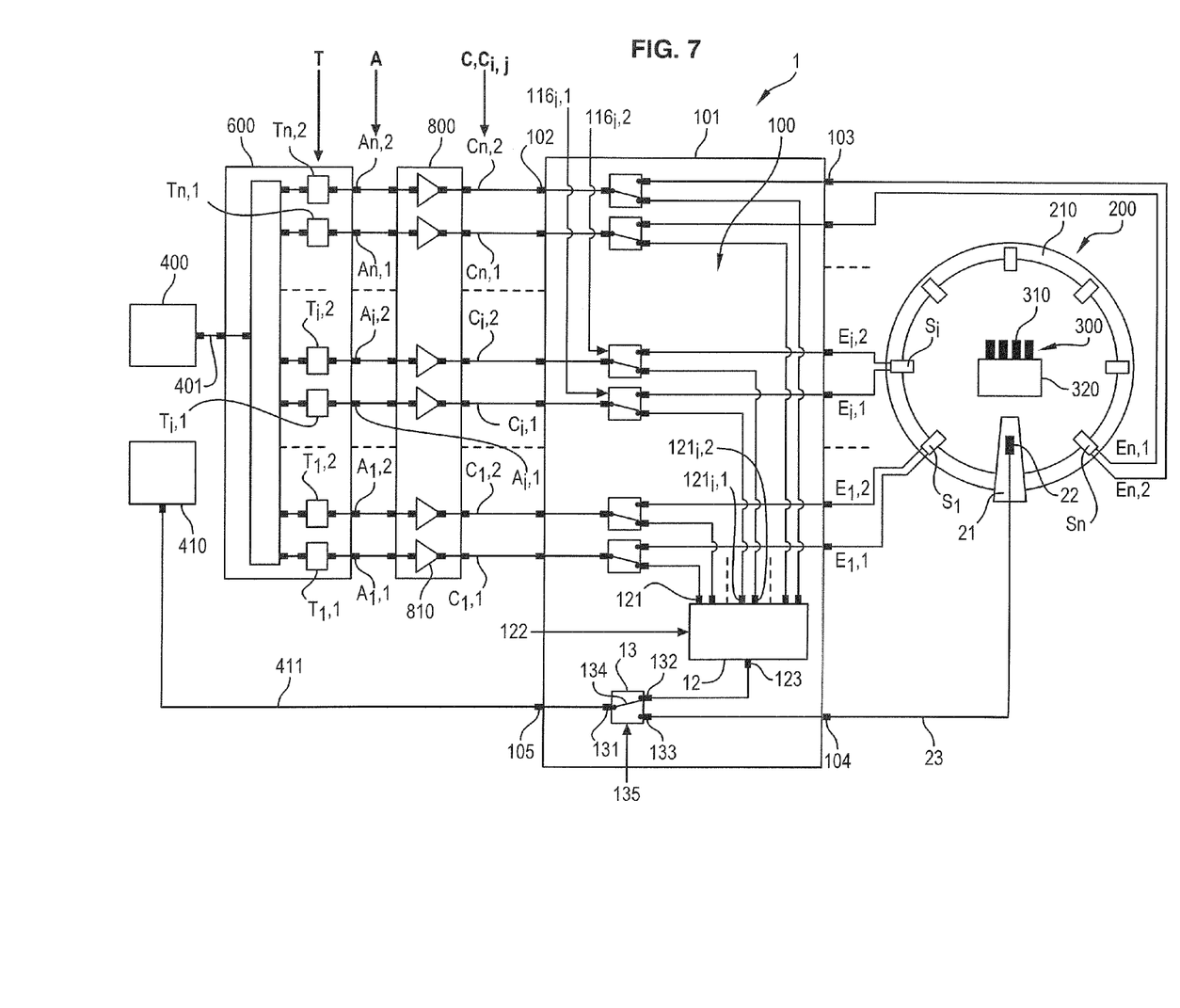
FIG. 7 is a schematic view of the calibration device of FIG. 6 according to an embodiment of the invention with a second position of the switching assembly in order to conduct the measurement for calibrating the channels.
Figure 8:
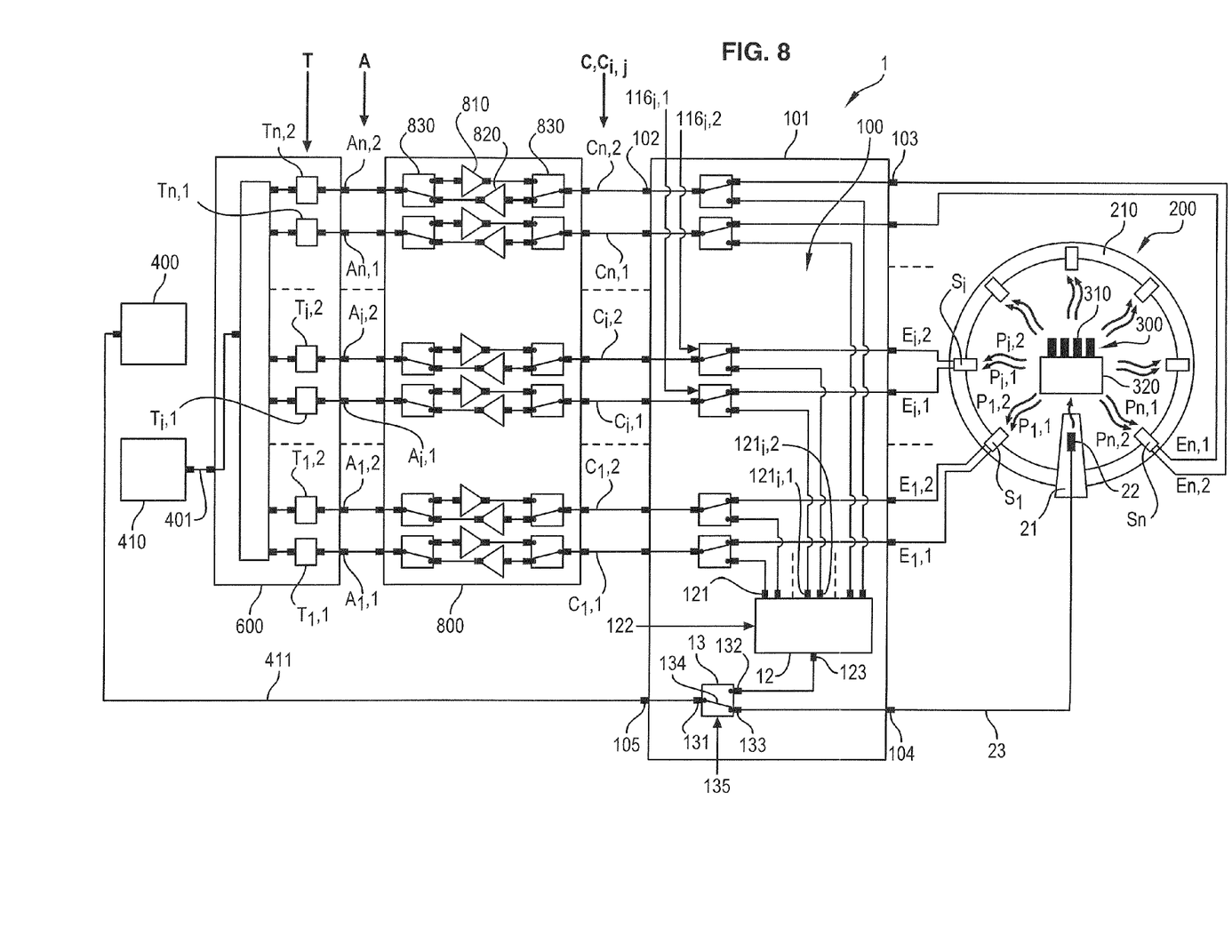
FIG. 8 is a schematic view of the device for calibrating the channels according to an embodiment of the invention and applied in a system for generating electromagnetic environments with a first position of the switching assembly in order to conduct the measurement of a wireless object under test emitting towards the bipolarized probes of the network.

In the case of a wireless object under test 300, the use of an auxiliary antenna 22 is known, as illustrated in FIGS. 3 to 8, and allowing establishment of a communications link with the object under test in order to receive information from the object under test when the latter receives signals from the probes (FIGS. 3, 5 and 6) or else sending of information towards the object under test when the latter emits signals towards the probes (FIG. 8).

Each probe S includes one or two inputs E depending on whether the probe is mono-polarized (having a radiation pattern according to a single polarization P) or bipolarized (having a radiation pattern according to two orthogonal polarizations P). The probes S are fixed according to a prescribed geometry on a common support 210. The probes S may also be movable around the object under test 300.

The network 200 of probes S is for example with a circular or spherical geometry, the center of which coincides with the center of the test area.

In an embodiment, the network 200 of probes S has a spherical arrangement on the support 210, the center of which coincides with the center of the test area.

In another embodiment, the network 200 of probes S is located on a cylindrical support 210, with for example circular cross-section, the axis of which passes through the center of the test area.

In another embodiment, such as the one illustrated as an example in the figures, the network 200 of probes S is carried by a support 210 with the shape of a circular annular crown in the vertical plane, the center of which coincides with the center of the test area.

In another embodiment, the support 210 of the network 200 of probes S may be an arch with the shape of a circular arc, for example a semi-circular arc, in either the vertical or else horizontal plane, and the center of which coincides with the center of the test area.

The probes S may for example be regularly distributed on their support 210, for example in an equiangular way relatively to the center of the test area, as this is illustrated in the figures.

The probes S are found in an anechoic chamber, the interior walls of which are entirely covered with electromagnetic absorbents in order to prevent reflections of electromagnetic radiations, for example as this is known, with the shape of foam pyramids, the apices of which are turned towards the interior of the chamber.

The support 210 of the probes surrounds the center of the test area. The support 210 may be open downwards in order to allow the passage of a mast 21 for supporting the object under test 300.

The support 210 of the probes for example has the shape of a ring.

The support 210 of the probes is for example vertical in the figures.

The support 210 of the probes may also be horizontal or have non-zero inclination relatively to the horizontal and to the vertical.

The support 210 of the probes may also be distributed and spread out in the anechoic chamber into various supports independent of each other and supporting a probe S or a group of probes S of the network 200.

The mast 21 may receive at its top a mechanical 2-axis positioner allowing the object under test to be tilted by ±90 degrees around the center of the test area so as to be able to conduct tests both in the vertical plane (elevational plane) or the horizontal plane (azimuthal plane) of the object under test for the case of a supporting configuration 210 with the shape of a circular annular crown placed in the vertical plane as illustrated in FIGS. 1 to 8.

The input E of each probe S is connected to a channel C for conveying a radio frequency signal as illustrated in FIGS. 1 to 4. The probe S therefore emits electromagnetic radiation towards the test area, which corresponds to the radio frequency signal present on its input E.

Vice versa, the probe may receive an electromagnetic signal radiated from the object under test located in the test area and transmit the resulting radio frequency signal over the channel C connected to its input E.

In the case of bipolarized probes S, each of the two inputs E of the probe corresponding to each of the orthogonal polarizations P is generally connected to a channel C for coveying a radio frequency signal as illustrated in FIGS. 6 to 8.

Figure 5:
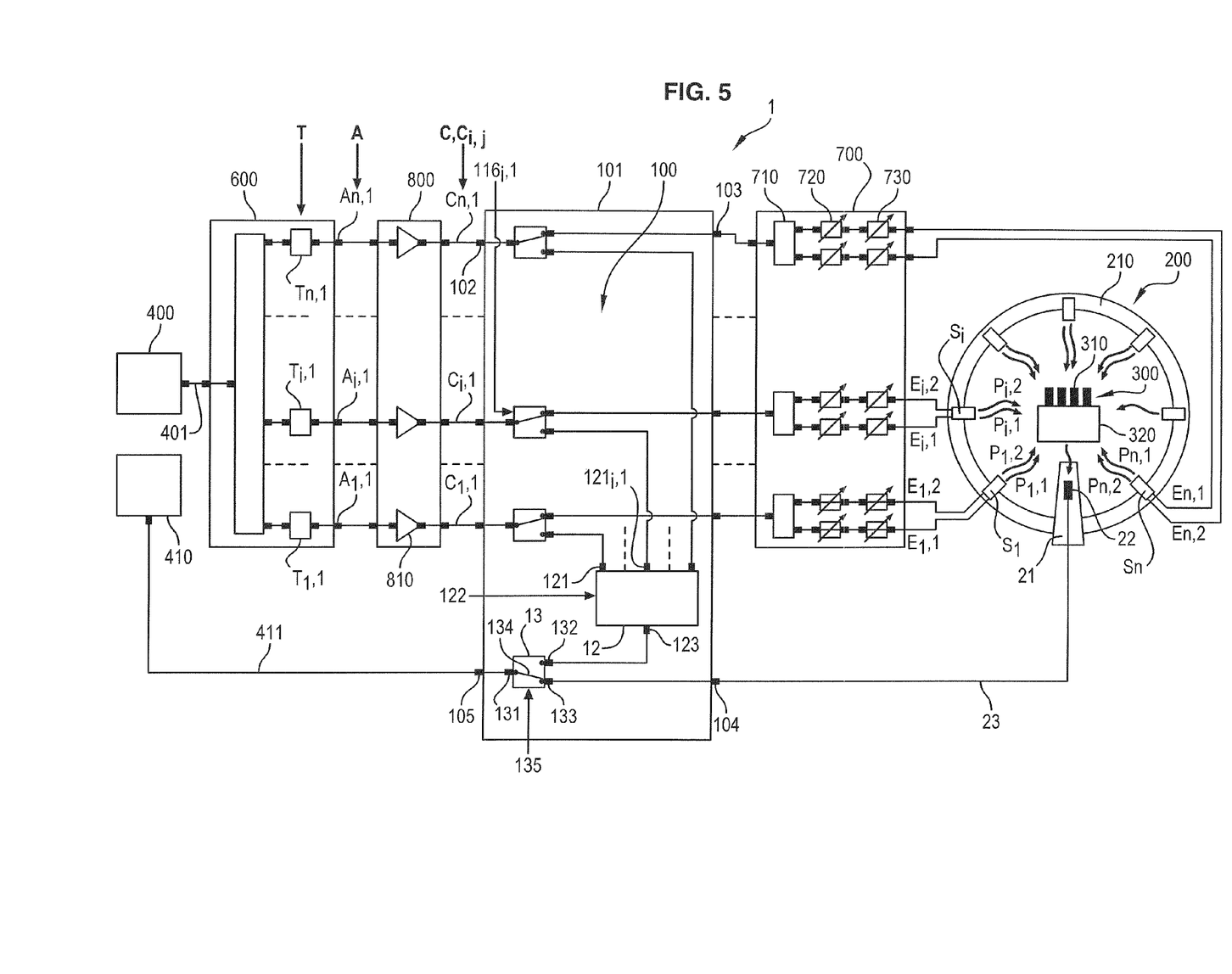
FIG. 5 is a schematic view of the device for calibrating the channels according to an embodiment of the invention and applied in a system for generating electromagnetic environments with a first position of the switching assembly in order to conduct the measurement of a wireless object under test receiving the signals from the bipolarized probes of the network, themselves powered through additional assemblies for generating polarization.

In the case of bipolarized probes, it is possible to add, like in FIG. 5, a module 700 commonly called a polarization generation unit which gives the possibility of dividing the radio frequency signal conveyed by a channel and of weighting each of the two thereby created routes in amplitude and in phase in order to access both inputs E of the bipolarized probe, the two orthogonal polarizations of which will combine in order to give circular or linear polarization with a given polarization discrimination according to the weighting coefficients used. In an embodiment, the polarization generation unit 700 for example consists of assemblies each comprising a 2-way divider 710, two controllable variable attenuators 720 and two controllable variable phase shifters 730. Each of the assemblies is connected at its input to a channel C and at both of its outputs to two inputs E of a bipolarized probe S. The polarization generation unit 700 is an economical means by which the number of channels C may be divided by two in the case of bipolarized probes S. Nevertheless, in this case, both polarizations of the probe S are related and emitted simultaneously, this is not the case when each of the inputs E of the probe is connected to an independent channel C.

Figure 3:
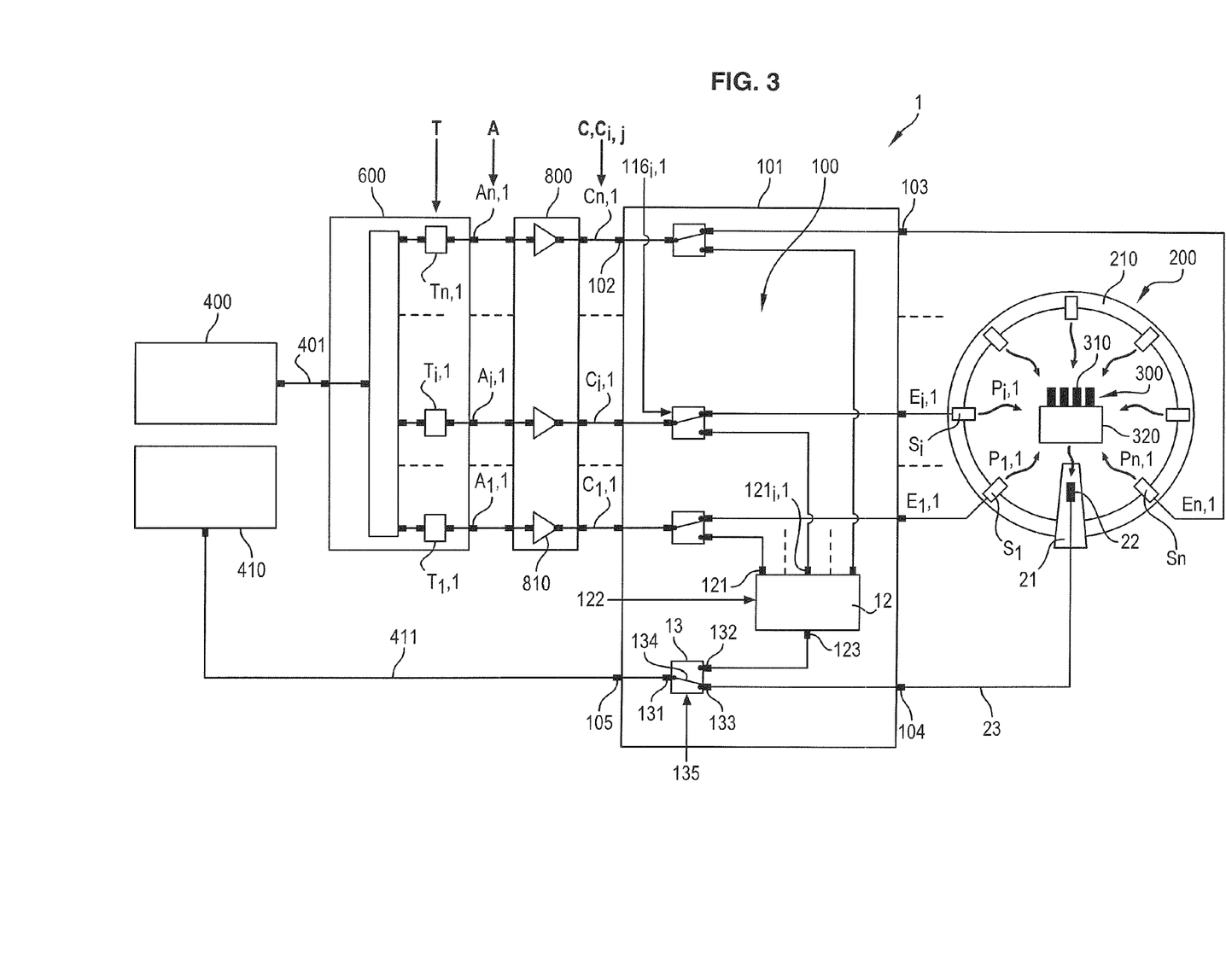
FIG. 3 is a schematic view of the device for calibrating the channels according to an embodiment of the invention and applied in a system for generating electromagnetic environments with a first position of the switching assembly in order to conduct the measurement of a wireless object under test receiving signals from the probes of the network.

A channel emulator 600 is used for multiplexing and transforming the radio frequency signal(s) coming from the signal generator 400 through one or more channels C up to the input E of the probes S of the network 200. Vice versa, the channel emulator 600 may be used for multiplexing and transforming the radio frequency signal(s) coming from the inputs E of the probes S of the network 200 through one or more channels C up to the signal receiver 410. The channel emulator 600 includes generally bidirectional accesses A corresponding to each channel C connected to each input E of each probe S as shown in FIGS. 1 and 3 or else connected to each input of each 2-way divider 710 of the polarization generation unit 700 as shown in FIG. 5. In the case of bipolarized probes, it is also possible to associate two channels C each connected to one of the two inputs E of the probe S as shown in FIGS. 6 and 8. Therefore, for the plurality of probes $S_1, \ldots, S_i, \ldots S_n$, a plurality of accesses $A_{1,1}, \ldots, A_{i,1}, \ldots, A_{n,1}$ is provided corresponding to a plurality of channels $C_{1,1}, \ldots, C_{i,1}, \ldots, C_{n,1}$ with $1 \leq i \leq n$ and $n \geq 2$ in the case of a single channel per probe like in FIGS. 1 to 5. For the plurality of probes $S_1, \ldots, S_i, \ldots, S_n$, a plurality of accesses $A_{1,1}, A_{1,2}, \ldots, A_{i,1}, A_{i,2}, \ldots, A_{n,1}, A_{n,2}$ and a plurality of channels $C_{1,1}, C_{1,2}, \ldots, C_{i,1}, C_{i,2}, \ldots, C_{n,1}, C_{n,2}$ with $1 \leq i \leq n$ and $n \geq 2$ are provided in the case of two distinct channels per probe like in FIGS. 6 to 8. It is known that the channel emulator 600 has generally digital and controllable means T for transforming the radio frequency signals coming from the signal generator 400 for each channel C. These transformation means T each allow independent application or not of the modifications for example of the phase, the amplitude and the group time to the radio frequency signal conveyed by each channel C. It is therefore possible by means of these transformation means T to independently apply complex corrections on the radio frequency signal from each of the channels C.

In order to obtain a suitable balance of power of the system for generating electromagnetic environments, it is known that each of the accesses $A_{i,j}$ of the channel emulator 600 may be connected to a radio frequency signal amplifier 810. These amplifiers 810 are part of a module 800 called an amplification unit as shown in FIGS. 1 to 7. The use of low noise amplifiers 820 may also be contemplated for amplifying the radio frequency signals coming from the probes S in the case of a receiving measurement configuration of the probe network as shown in FIG. 8. In the latter case it is also possible to apply a bidirectional amplification unit 800 comprising assemblies each consisting of two switches 830, of an amplifier 810 and of an amplifier 820 mounted head-to-tail so as to, depending on the positions of the switches 830, allow amplification of the radio frequency signal conveyed by each channel C from the signal generator 400 to the input E of the probes S or else amplification of the radio frequency signal coming from each input E of the probes S and conveyed by each channel C to the receiver 410 as shown in FIG. 8.

According to an embodiment of the invention, the device for calibrating the channels 100 is placed between the channel emulator 600 and the network of probes 200 and more specifically between the amplification unit 800 and the polarization generation unit 700 if they exist.

According to an embodiment of the invention, the device for calibrating the channels 100 comprises:

An assembly of switches or couplers or dividers 11 interposed between the accesses A of the channel emulator 600 and the inputs E of the probes S of the network 200. More specifically and for example, a switch $11_{i,1}$ comprises a common access $112_{i,1}$ connected for each channel $C_{i,1}$ to the access $A_{i,1}$ of the emulator 600 through the amplification unit 800 if it exists, like in FIGS. 1 to 8, an access $113_{i,1}$ connected to the input $E_{i,1}$ of the probe $S_i$ of the network 200 like in FIGS. 1 to 4 and 6 to 8 or else to both inputs $E_{i,1}$ and $E_{i,2}$ of the probe $S_i$ through the polarization generation unit 700 if it exists like in FIG. 5 and an access $114_{i,1}$ connected to the access $121_{i,1}$ of the assembly of switches or dividers 12. The position of the switching member $115_{i,1}$ of the switch $11_{i,1}$ is controlled by means of a control signal $116_{i,1}$ and in one position allows the common access $112_{i,1}$ to be connected to the access $113_{i,1}$ like in FIGS. 1, 3, 5 and 8 and allows in the other position the common access $112_{i,1}$ to be connected to the access $114_{i,1}$, like in FIGS. 2, 4 and 7.

An assembly of switches or dividers 12 for which the accesses 121 are connected to the accesses 114 of the switches or couplers or dividers 11 and for which the common access 123 is connected to the access 132 of the switch 13. More specifically and for example, the access $121_{i,1}$ of the assembly of switches 12 is connected to the access $114_{i,1}$ of the switch $11_{i,1}$ as illustrated in FIGS. 1 to 8. The positions of the switching members of the assembly 12 are controlled by means of control signals 122 and allow any access $121_{i,j}$ to be connected to the common access 123.

A switch 13, whose access 132 is connected to the common access 123 of the assembly of switches or dividers 12, whose access 133 is connected to the cable 23 either connecting the antenna under test 310 (FIGS. 1 and 2) or else the communications antenna 22 (FIGS. 3 to 8) and whose common access 131 is connected to the cable 411 connecting the radio frequencies signal receiver 410 in the case of a measurement configuration with the probes S of the network 200 operating in emission (FIGS. 1 to 7) or else connecting the radio frequency signal generator 400 in the case of a measurement configuration with the probes S of the network 200 operating in reception (FIG. 8). The position of the switching member 134 of the switch 13 is controlled by means of a control signal 135 and in one position allows the common access 131 to be connected to the access 133 like in FIGS. 1, 3, 5, 6 and 8 and allows in the other position the common access 131 to be connected to the access 132 like in FIGS. 2, 4 and 7.

The elements 11, 12 and 13 are for example grouped in a unit 100 for calibrating the channels inside a same physical casing 101. The different physical interfaces of this casing 101 are materialized by connectors 102 connected to the common accesses 112 of the switches or dividers or couplers 11, connectors 103 connected to the accesses 113 of the switches or dividers or couplers 11, a connector 104 connected to the access 133 of the switch 13 and a connector 105 connected to the common access 131 of the switch 13. Thus, all the complex transmission coefficients of all the possible paths between the different connectors of the casing 101 depending on the different positions of the switching members of the elements 11, 12 and 13 may be characterized and recorded totally independently and separately from the means for generating an electromagnetic environment so as to be then used in the calculation of the correction coefficients of each channel. In an embodiment, calibration will be performed up to the wall transition at the output of the casing 101.

According to an embodiment of the invention, the operation of the device for calibrating the channels 100 is the following:

In the first position of the device for calibrating the channels 100 illustrated in FIGS. 1, 3, 5, 6 and 8, the device is used transparently in order to measure the object under test 300 with the system for generating electromagnetic environments.

In this first position, for each channel $C_{i,j}$, the switch $11_{i,j}$ connects the output $A_{i,j}$ of the channel emulator 600 to the input $E_{i,j}$ of the probe $S_i$ of the network 200 by means of the common access $112_{i,j}$ connected to the access $113_{i,j}$ by the switching member $115_{i,j}$. In this first position, the switch 13 connects the cable 23 coming from the antenna under test 310 or from the communications antenna 22 to the receiver of radio electric signals 410 for the measurement configurations of FIGS. 1, 3, 5 and 6 or to the generator of radio electric signals 400 for the measurement configuration of FIG. 8 by means of the access 133 connected to the common access 131 through the switching member 134.

In this first position, the radio frequency signals transmitted to the inputs $E_{i,j}$ of the different probes $S_i$ through the channel $C_{i,j}$ allow simulation of a given electromagnetic environment, each radio frequency signal of each channel $C_{i,j}$ then being specific to each input $E_{i,j}$ of each probe $S_i$ and which may be different and predetermined from one probe input to the other.

In this first position, the signals coming from the antenna under test 310 (FIG. 1) or of the communications antenna 22 (FIGS. 3, 5 and 6) are switched by the switch 13 towards the radio frequency signal receiver 410. In this first position, for a measurement configuration with the probes S of the network 200 operating as a receiver (FIG. 8), the signals from the radio frequency generator 400 may be switched by the switch 13 towards either the communications antenna 22 or else the antenna under test 310.

Of course, in the first position, a single channel $C_{i,j}$ or a sub-assembly of channels C may be switched by the switches 11 onto the inputs E of the probes S, while the other channels are not switched onto their associated probe input. Therefore, in the first position, at least one channel $C_{i,j}$ is switched by the switch $11_{i,j}$ onto the input $E_{i,j}$ of the probe $S_i$. In this first position, at least one channel $C_{i,j}$, one sub-assembly of channels C or all the channels C are switched by the switch $11_{i,j}$, one sub-assembly of switches 11 or all the switches 11 are switched onto the input $E_{i,j}$ of the probe $S_i$, one sub-assembly of the inputs E of the probes S or of all the inputs E of the probes S.

Figure 4:
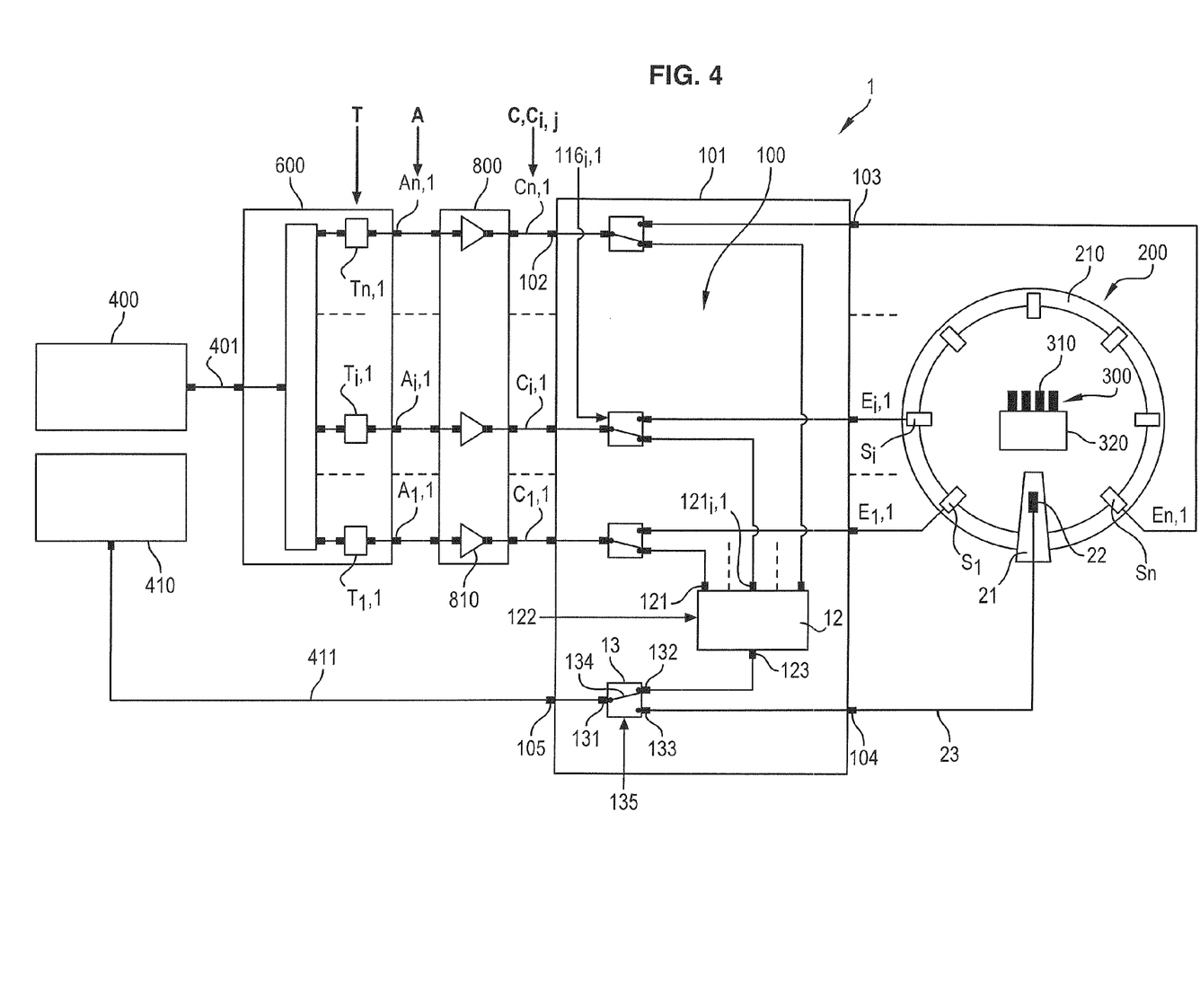
FIG. 4 is a schematic view of the calibration device of FIG. 3 according to an embodiment of the invention with a second position of the switching assembly for conducting the measurement for calibrating the channels.

In the second position of the device for calibrating the channels 100 illustrated in FIGS. 2, 4 and 7, the device 100 is used for carrying out measurements for calibrating the channels without passing through the probes S of the probe network 200 and without passing through the antenna under test 310 or the communications antenna 22. This is therefore a step which is applied prior to the first position of the device 100 for measuring the object under test.

In this second position, for each channel $C_{i,j}$, the switch $11_{i,j}$ connects the output $A_{i,j}$ of the channel emulator 600 to the access $121_{i,j}$ of the assembly of switches or dividers 12 by means of the common access $112_{i,j}$ connected to the access $114_{i,j}$ through the switching member $115_{i,j}$. In this second position, the assembly of switches or dividers 12 give the possibility of routing the selected one of the accesses $121_{i,j}$ connected to the access $114_{i,j}$ towards the common access 123. In this second position, the switch 13 connects the access 132 itself connected to the common access 123, to the radio-electric signal receiver 410 for the calibration configurations of FIGS. 2, 4 and 7 by means of the access 132 connected to the common access 131 through the switching member 134 or vice versa to the radio-electric signal generator 400 in the case of an application of the system for generating electromagnetic environments with the probes of the network 200, configured in order to receive the radiations emitted by the object under test.

In this second position, at least one channel $C_{i,j}$ one sub-assembly of the channels C or all the channels C are switched by the switch $11_{i,j}$, one sub-assembly of the switches 11 or all the switches 11 onto the access $121_{i,j}$, one sub-assembly of accesses 121 or all the accesses 121 of the assembly of switches or dividers 12.

When an access $121_{i,j}$ is selected on the module 12, the radio frequency signal of the channel $C_{i,j}$ is then routed to the common access 123, and then to the signal receiver 410 via the access 132 connected to the common access 131 through the switching member 134 and the return route 411. This second position therefore allows measurement and recording of the whole of the complex characteristics of each channel from the signal generator 400 up to the signal receiver 410 without passing through the probe network. The thereby measured complex values may then be used in calculating the correction coefficients of each channel.

Alternatively, the whole of the signals present on all the accesses 121 are transmitted in multiplexed form by the module 12 onto the common access 123.

A control unit is provided for controlling from the outside the control inputs 116, 135 for the switching of the switches 11 and 13, as well as the control input 122 when this input 122 is present. In the case when the multiplexer 12 is totally passive, there is no control 122. Provision is therefore made for means 116, 135 for controlling the channel calibration device 100 in order to have it pass between both of the first and second positions.

According to an embodiment of the invention, a method for calibrating the channels between the plane corresponding to the output of the radio frequency signal generator 400 and the plane corresponding to the accesses 103 of the casing 101 containing the channel calibration device 100, consists of the following main steps:

all the complex transmission coefficients of all the possible paths between the access planes 102 and 103 and of all the possible paths between the access planes 102 and 105 of the casing 101 are measured and recorded according to the different positions of the switching members of the elements 11, 12 and 13. These complex transmission coefficients may be characterized and recorded totally independently of and separately (at the factory for example) from the means for generating electromagnetic environments. These complex transmission coefficients are measured on the operating frequency range of the system 1. The measurement of these complex transmission coefficients may be repeated at very spaced-out time intervals of the order of one or more years and compatible with the calibrations of conventional microwave frequency measurement appliances.

The device 100 is placed in the second so-called channel calibration position, in which at least one of the channels $C_{i,j}$ is connected to the input of the radio frequency signal receiver 410 without passing through the network of probes 200 or else vice versa to the output of the radio frequency signal generator 400 without passing through the network of probes 200.

The values of the complex transmission coefficient are measured and recorded for each channel $C_{i,j}$ between the plane corresponding to the output of the radio frequency signal generator 400 and the plane corresponding to the input of the radio frequency signal receiver 410 while passing through the channel emulator 600 and the amplification unit 800 if it exists. These complex transmission coefficients are measured on the operating frequency range of the system 1. The measurement of these complex transmission coefficients has to be repeated at close time intervals in order to take into account the time-dependent change in the characteristics of the channel emulator 600 and of the different active elements such as the amplification unit 800 placed between the radio frequency signal generator 400 and the channel calibration system 100. These time intervals may be of the order of one hour or several hours. It is sometimes necessary to conduct this measurement at each powering up of the channel emulator and of the active elements placed between the radio frequency signal generator 400 and the system for calibrating the channels 100.

From the complex coefficients measured in the previous steps, the complex values of the corrections to be made to each transmission channel $C_{i,j}$ are calculated and recorded in order to make the responses of the channels C uniform in terms notably of phase, amplitude and group time over the frequency band which will be used for the measurement subsequently. These corrections include the characteristics and variabilities (for example time variabilities, thermal variabilities, etc.) of the channel emulator 600 and of all the active elements placed between the radio frequency signal generator 400 and the system for calibrating the channels 100.

The device 100 is placed in the first so-called measurement position, in which at least one of the channels $C_{i,j}$ is connected to the input $E_{i,j}$ of the probe $S_i$ and the antenna under test 310 or the communications antenna 22 is connected to the input of the radio frequency signal receiver 410.

During the measurement or after the measurement of the object of the test 300, the complex values of corrections calculated in the previous steps for each channel $C_{i,j}$ are applied.

According to an embodiment of the invention, the method for calibrating the channels by means of the calibration device 100 disassociates the actions for calibrating the channels C from the calibration actions of the network of probes 200, giving the possibility of making the calibration of the channels C and the calibration of the network of probes 200 completely independent. The calibration of the network of probes 200 notably consisting of uniformizing the responses of the probes in terms of phase, amplitude, radio electric access, phase center and group time, may therefore be carried out separately with proven and very accurate techniques at time intervals of the order of one year and compatible with the calibrations of conventional microwave frequency measurement appliances.

applying a correction to each channel $C_{i,j}$ for which the complex values are obtained from the calibration of the channels C, carried out independently of the calibration of the probe network.

applying an additional correction to each channel $C_{i,j}$ for which the complex values are obtained from the calibration of the probe network carried out separately and totally independently of the calibration of the channels.

Therefore, the device according to the invention gives the possibility of correcting the variability of the channel emulator 600 and of the active elements like the amplification unit 800, by allowing frequent recalibration of each channel $C_{i,j}$, very rapidly, in an automatable way and independently of the network of probes 200, which avoids having to calibrate every time the probes once again, the calibration of the channels becoming thus easy, rapid and very accurate. The corrections carried out from calibrations of the channels carried out more frequently thus allow more stable and more accurate measurements over time of objects under test 300 by means of the system for generating electromagnetic environments 1. This accuracy is reinforced by the fact that the calibration of the channels having then become independent of the calibration of the probes, gives the possibility of carrying out calibration of the probes with proven and very accurate methods and applying additional and very efficient corrections to each channel $C_{i,j}$ in order to uniformize the response of the probes for each channel $C_{i,j}$.

A device and a method for rapid, easy, accurate and wideband calibration of the channels of a system for generating electromagnetic environments including a network of a plurality of probes, are therefore obtained.

In the foregoing, the generator forms the first signal emitting unit (400), the receiver forms the second signal receiving unit (410).

The invention claimed is:

1. A system for simulating electromagnetic environments, including:
    a network of a plurality of probes for emitting and/or receiving electromagnetic radiations to or from a test point at a distance from the probes in order to test at least one test antenna located at the test point,
    a channel emulator having a multiplicity of channels,
    a first signal emitting unit,
    a second signal receiving unit,
    one of the first and second units being connected to the channel emulator,
    characterized by a switching device between the channel emulator and the plurality of probes, wherein the switching device has:
    a multiplicity of first accesses connected respectively to the multiplicity of channels;
    a plurality of second accesses connected respectively to the plurality of probes;
    a third access connected to the other of the first and second units;
    a fourth access connected to the at least one test antenna
    a first measurement position for testing the at least one test antenna through at least one channel, in which at least one of the first accesses is connected to at least one of the second accesses and the third access is connected to the fourth access, so that the switching device connects the emulator respectively to at least one of the probes via said at least one associated channel and connects the other of the first and second units to the test antenna; and
    a second position for calibrating at least one of the channels, in which at least one of the first accesses is connected to the third access, the fourth access is disconnected from the third access and the second accesses are disconnected from the first accesses and from the third access, so that the switching device connects the emulator to the other of the first and second units via said at least one associated channel without passing through the network of probes, the second position being distinct from the first position.

2. The system according to claim 1, wherein the channel emulator is connected to the first signal emitting unit, and the third access is connected to the second signal receiving unit.

3. The system according to claim 1, wherein the channel emulator is connected to the second receiving unit, and the third access is connected to the first signal emitting unit.

4. The system according to claim 1, wherein the switching device in the first measurement position connects a multiplicity of accesses of the emulator respectively to the plurality of the probes via the multiplicity of the associated channels and connects the other of the first and second units to the test antenna, and the switching device in the second position for calibrating the channels connects the multiplicity of accesses of the emulator to the other of the first and second units via the multiplicity of the associated channels without passing through the network of probes, the second position being distinct from the first position.

5. The system according to claim 1, wherein the channel emulator has controllable transformation means for individually varying for each channel at least one parameter from frequency, phase, amplitude and polarizations of the signal of each associated probe.

6. The system according to claim 1, including means for controlling the switching device to enable the switching device to pass between both of the first and second positions and for maintaining it in any of the first and second positions.

7. The system according to claim 1, wherein the switching device includes switches or the like having said positions for ensuring said connections.

8. The system according claim 1, wherein the system comprises a unit for generating two first and second polarizations orthogonal to each other in order to divide the signal conveyed by said at least one channel into two first and second routes having both first and second polarizations orthogonal to each other, respectively, both routes being connected to the associated probe, weighting means being provided for weighting each of the two first and second routes in amplitude and in phase.

9. The system according to claim 1, wherein the test antenna is connected to the other of the first and second units through wiring via at least one cable.

10. The system according to claim 1, wherein the test antenna is connected wirelessly to the other of the first and second units via at least one radio link with an on-board emitter and/or receiver.

11. The system according to claim 1, wherein the switching device is placed between the channel emulator and the network of probes.

12. A method for simulating electromagnetic environments by means of a system for simulating electromagnetic environments according to claim 1, the system including:
    a network of a plurality of probes for emitting and/or receiving electromagnetic radiations to or from a test point at a distance from the probes in order to test at least one test antenna located at the test point,
    a network emulator having a multiplicity of channels,
    a first signal emitting unit,
    a second signal receiving unit, one of the first and second units being connected to the channel emulator, and
    a switching device between the channel emulator and the plurality of probes, wherein the switching device has:
    a multiplicity of first accesses connected respectively to the multiplicity of channels;
    a plurality of second accesses connected respectively to the plurality of probes;
    a third access connected to the other of the first and second units; and
    a fourth access connected to the at least one test antenna
    wherein:
        the switching device is placed in a second position for calibrating at least one of the channels, in which at least one of the first accesses is connected to the third access, the fourth access is disconnected from the third access and the second accesses are disconnected from the first accesses and from the third access, so that the switching device connects the emulator to the other of the first and second units via said at least one associated channel without passing through the network of probes, a multiplicity of first accesses connected respectively to the multiplicity of channels;

a plurality of second accesses connected respectively to the plurality of probes—in the second position for calibrating at least one of the channels, the value of a complex transmission coefficient is acquired on each channel between the first signal emitting unit and the second signal receiving unit while passing through the channel emulator without passing through the network of probes, the switching device is then placed in a first measurement position for testing the at least one test antenna through at least one channel, in which at least one of the first accesses is connected to at least one of the second accesses and the third access is connected to the fourth access, so that the switching device connects the emulator respectively to at least one of the probes via said at least one associated channel and connects the other of the first and second units to the test antenna, and the test antenna is tested in the first measurement position by sending at least one signal from the first signal emitting unit to the second signal receiving unit via said at least one channel through said at least one probe and by applying to the signal a correction calculated according to at least the value having been acquired from the complex transmission coefficient on said at least one channel.

13. The method according to claim 12, wherein the correction is calculated according to at least the value having been acquired from the complex transmission coefficient on said at least one channel and further according to transmission parameters having been measured beforehand on the device.

* * * * *